United States Patent
Moon et al.

(10) Patent No.: US 8,790,584 B2
(45) Date of Patent: Jul. 29, 2014

(54) SYSTEM FOR REFINING UMG SI USING STEAM PLASMA TORCH

(75) Inventors: Byung Moon Moon, Seoul (KR); Je Sik Shin, Incheon (KR); Tae U Yu, Seoul (KR); Hyun Jin Koo, Siheung-si (KR); Dong Ho Park, Seoul (KR); Ho Moon Lee, Seoul (KR)

(73) Assignee: Korea Institute of Industrial Technology (KR)

( * ) Notice: Subject to any disclaimer, the term of this patent is extended or adjusted under 35 U.S.C. 154(b) by 404 days.

(21) Appl. No.: 12/938,506

(22) Filed: Nov. 3, 2010

(65) Prior Publication Data

US 2011/0142724 A1 Jun. 16, 2011

(30) Foreign Application Priority Data

Nov. 6, 2009 (KR) .................. 10-2009-0106779

(51) Int. Cl.
*B01J 19/08* (2006.01)

(52) U.S. Cl.
USPC .... 422/186; 422/186.04; 204/164; 204/158.2

(58) Field of Classification Search
CPC ... H05H 1/48; H05H 1/42; H05H 2001/3484; C01B 22/037
USPC .................. 422/186, 186.04; 204/158.2, 164
See application file for complete search history.

(56) References Cited

U.S. PATENT DOCUMENTS 5,363,781 A * 11/1994 Chang et al. .................. 110/250
7,000,678 B1 * 2/2006 Mon et al. ..................... 164/507
2003/0150374 A1 * 8/2003 Sasatani et al. ................. 117/50
2009/0064581 A1 * 3/2009 Nielsen et al. .................... 48/78
2011/0041404 A1 * 2/2011 Yu et al. ......................... 48/111

FOREIGN PATENT DOCUMENTS

| EP | 0994637 | 4/2000 |
| JP | 05262512 | 10/1993 |
| WO | 2007116326 | 10/2007 |

OTHER PUBLICATIONS

European Search Report—European Application No. EP 10 01 4263 issued on Feb. 17, 2014, citing Ikeda Takashi et al. "Elimination of Boron in Molten Silicon by Reactive Rotating Plasma Arc Melting", JP H05 262512, US 20091064581, US 7000 678, WO 2007/116326 and EP 0 994 637.

Takashi Ikeda et al., Elimination of Boron in Molten Silicon by Reactive Rotating Plasma Arc Melting, Materials Transactions, 1996, pp. 983-987.

* cited by examiner

*Primary Examiner* — Xiuyu Tai
(74) *Attorney, Agent, or Firm* — Cantor Colburn LLP

(57) ABSTRACT

Disclosed is a system for refining UMG Si including a vacuum chamber, a cold crucible disposed within the vacuum chamber, a device disposed within the vacuum chamber to supply Si to the cold crucible, a steam plasma torch disposed above the cold crucible to apply steam plasma formed by introducing a reactive gas into plasma flame by an inert gas to the Si supplied to the cold crucible, and an impurity collector disposed above the cold crucible within the vacuum chamber to collect impurity gas generated in the cold crucible and discharge the collected impurity gas to the outside of the vacuum chamber.

14 Claims, 12 Drawing Sheets

SYSTEM FOR REFINING UMG SI USING STEAM PLASMA TORCH

The present invention claims priority of Korean Patent Application No. 10-2009-0106779, filed on Nov. 6, 2009, which is incorporated herein by reference.

BACKGROUND OF THE INVENTION

1. Field of the Invention

The present invention relates to a system for refining UMG Si using a steam plasma torch. More particularly, the present invention relates to a system for refining UMG Si which refines UMG Si into solar-grade Si using a steam plasma torch.

2. Description of Related Art

The global solar cell market has been growing strongly by annual average growth of over 35% since the mid-1990s wherein crystalline silicon-based solar cells account for more than 97% of solar cells in the market in respect of material and take the initiative in market growth. In the meantime, high purity silicon material which is a core material for solar cells has been supplied by scraps of single crystalline silicon for semiconductor wafers or off-specification polycrystalline silicon. However, the global solar cell market has been rapidly growing since the mid-1990s and the supply did not fall short of the fast growing demand with the entrance toward the industrialized phase and consequently the solar cell market has reached the situation of serious supply shortage since 2004. Shortage phenomenon of silicon material will be continued worldwide for some time due to the demand for investment in facilities on a large scale in order to manufacture the polycrystalline silicon raw material.

At the present time, 90% or more of the global production of high purity polysilicon is produced by a Siemens process, which is also called as trichlorosilane (TCS) method and developed by Siemens in Germany. In the Siemens process, the TCS refined to high purity is mixed, to increase a recovery rate, with hydrogen gas and introduced into in an extraction area at 1,000 to 1,100° C., followed by extraction of high purity solid polycrystal, thereby producing high purity polysilicon. The silicon produced by this process is high in cost and is so high pure that a content of impurities is at ppb level. However, Si for a solar cell does not require such high purity.

Therefore, nowadays, there have begun efforts of producing upgraded metallurgical grade (UMG) Si of about 5N purity (99.999%) from metal Si through an inexpensive process and using the produced UMG Si as the material for a solar cell. Use of the UMG Si has an advantage that it is possible to halve the ratio of raw material, which accounts for 30% of fabrication cost of crystalline Si solar cell. However, the UMG Si has higher concentration of boron and phosphorus that are used as dopant, as compared with that required for a substrate to be used as a solar cell.

Therefore, in order to use the UMG Si as a solar cell, it is essential to raise the purity thereof. The UMG Si may include other impurity elements such as boron, phosphorus, arsenic and antimony. According to types of the impurity element, different impurity refining methods are required.

There have been performed studies on a process for refining the UMG Si which allows obtaining of polycrystalline wafer and photocell capable of being competitive with classical material in aspects of both converting efficiency and cost.

Some study groups have been studied refinement of metallurgical grade Si using plasma. A study group in France has used argon plasma which is induced by adding oxygen as reactive gas. All experiments were performed at a small scale (<250 g). Also, other Japanese study group has been developed a refinement process in which electron beam, arc plasma and directional solidification are associated from the study on removal of boron, or one of the impurities. The electron beam was used to remove the phosphorus, the plasma treatment was used to remove the boron in association with use of water, and directional solidification consisting in two steps was used to remove metal impurities. An amount of Si processed in these studies has reached 300 kg per batch.

However, though it is possible to produce solar grade Si directly from the metallurgical grade Si, the aforementioned process has problems that refining effect is low and cost effectiveness is not high as the plasma process is performed at a low temperature and productivity is low as it is a batch type process. In addition, there exists a problem of recontamination due to impurities in a chamber during UMG Si refining process.

SUMMARY OF THE INVENTION

It is an object of the present invention to provide a system for refining UMG Si using a steam plasma torch, which performs a plasma process at raised temperature to enhance refining effect of UMG Si into SG Si and can prevent recontamination due to impurity gas produced during refinement of UMG Si.

It is another object of the present invention to provide a system for refining UMG Si using a steam plasma torch, which has a structure for introducing reactive gas stably into plasma flame by inert gas.

It is still another object of the present invention to provide a system for refining UMG Si using a steam plasma torch, which allows ingot continuously casting of polysilicon and thus has high productivity and cost efficiency.

In one embodiment, a system for refining UMG Si includes a vacuum chamber, a cold crucible disposed within the vacuum chamber, a device for feeding UMG Si to the cold crucible, a steam plasma torch for applying steam plasma to the Si fed to the cold crucible, the steam plasma formed by introducing a reactive gas into plasma flame by an inert gas, and an impurity collector for collecting impurity gas generated from the cold crucible.

Preferably, the impurity collector includes: a collecting plate for collecting the vacuum chamber gas including impurity generated from the cold crucible; a discharge pipe for discharging the vacuum chamber gas collected by the collecting plate to the outside of the vacuum chamber; a dust collector for collecting a dust of the gaseous impurities from the vacuum chamber gas received through the discharge pipe; a filter for filtering the vacuum chamber gas received from the dust collector to remove the fine powdery impurities out of the vacuum chamber gas; and an introduction pipe for introducing the vacuum chamber gas to the inside of the vacuum chamber.

Preferably, the dust collector includes a cooling system for cooling the dust into solid phase.

Preferably, the impurity collector further includes a cooling structure installed on the impurity collecting plate.

Preferably, the plasma torch includes an electrode rod having a predetermined length and formed with a tip at an end thereof and being electrically connected with an external cathode power supply; an internal cover surrounding the electrode rod in a longitudinal direction of the electrode rod with a first space formed between the internal cover and the electrode rod and being electrically connected with an external anode power supply; an external cover surrounding the internal cover in the longitudinal direction with a second space formed between the external cover and the internal cover; a nozzle cover unit having an internal nozzle cover connected with the internal cover and an external nozzle cover connected with the external cover, the internal nozzle cover covering the tip and having a horizontal nozzle end formed at a lower end thereof, the horizontal nozzle being formed with a first orifice, and the external nozzle cover, covering the internal nozzle cover except for the horizontal nozzle end and having an open bottom and a vertical nozzle end vertical to the horizontal nozzle end at a lower end thereof, the vertical nozzle end formed along a circumference of the horizontal nozzle end to the open bottom of the external nozzle cover, the vertical nozzle end being formed with a second orifice(s) in the upper part thereof and a third orifice(s) in the lower part thereof, wherein to the first orifice an inert gas for generation of plasma is fed through the first space, to the second orifice a reactive gas for formation of steam plasma is fed through a tube installed in the second space, and to the third orifice an inert gas for generation of plasma is fed through the second space.

Preferably, the second orifices are formed in bisymmetry and the third orifices are formed in bisymmetry.

Preferably, the inert gas is Ar.

Preferably, the reactive gas is one or more selected from the group consisting of H2 and H2O.

Preferably, a ratio of the reactive gas to the inert gas fed to the first orifice and the third orifice(s) is 0.1 to 10.0 vol %.

Preferably, a cooling structure is formed in an inside of the electrode rod.

Preferably, the cold crucible is electrically connected with an anode power supply.

Preferably, cooling lines are formed along the external cover and the nozzle cover unit, respectively.

Preferably, the system for refining UMG Si in accordance with a preferred embodiment of the present invention further includes a steam generator for feeding steam from the outside of the steam plasma into the steam plasma torch.

Preferably, the cold crucible is an open-bottom cold crucible.

Preferably, the cold crucible is structured in such a manner that at least part thereof along the circumference is divided into segments by means of vertical slits formed from the top to the bottom thereof.

In accordance with the present invention, it is possible to obtain a system for refining UMG Si using a steam plasma torch, which can enhance refining ability of UMG Si into SG Si by raising a temperature of plasma process and prevent recontamination by impurity gas generated during the Si refinement.

Also, it is possible to introduce the reactive gas into plasma flame by inert gas stably and apply the resulting optimum steam plasma to the refinement of the UMG Si, thereby capable of maximizing the refining ability of the UMG Si.

Further, it is possible to allow continuous process of refinement of UMG Si and ingot casting, thereby capable of raising productivity and cost efficiency.

DESCRIPTION OF SPECIFIC EMBODIMENTS

The advantages, features and aspects of the invention will become apparent from the following description of the embodiments with reference to the accompanying drawings, which is set forth hereinafter.

Figure 1:
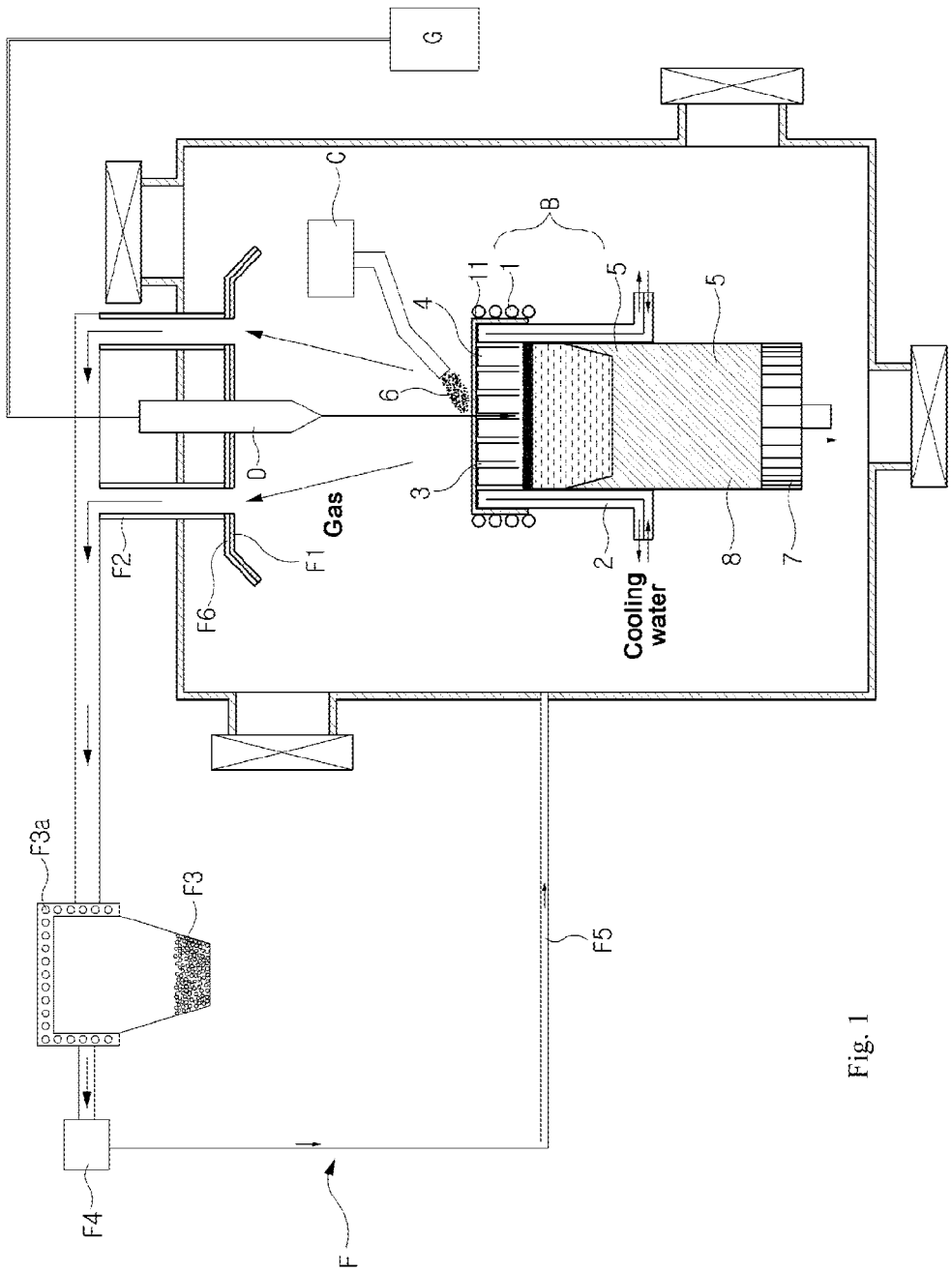
FIG. 1 is a schematic side view illustrating a system for refining UMG Si in accordance with a preferred embodiment of the present invention.

FIG. 1 is a schematic side view illustrating a system for refining UMG Si in accordance with a preferred embodiment of the present invention.

As illustrated in FIG. 1, the system for refining UMG Si in accordance with a preferred embodiment of the present invention includes a vacuum chamber A, a cold crucible B disposed within the vacuum chamber A, a device for feeding UMG Si to the cold crucible B, a steam plasma torch D for applying steam plasma to the Si fed to the cold crucible B, the steam plasma formed by introducing a reactive gas into plasma flame by an inert gas, and an impurity collector F for collecting impurity gas generated in the cold crucible B.

In a preferred embodiment of the present invention, the vacuum chamber A is provided and a known arbitrary vacuum pump can be used so that an inside of the vacuum pump A reaches a vacuum level required for a process.

Next, the cold crucible B is disposed within the vacuum chamber A. While a conventionally known arbitrary cold crucible B can be used in the present invention, in order to allow a continuous process, preferably used is an open-bottom cold crucible, for example, which has a vertical shaft and a water cooling structure, is surrounded by an induction coil 1 and is made of thermal conductive and electric conductive metal material.

Preferably, the cold crucible B has a structure in that at least thereof along the circumference is divided into segments 4 by means of vertical slits 3 formed from the top to the bottom thereof. The induction coil 1 surrounds the cold crucible B and permeates a magnetic field generated by apply of current into an inside of the cold crucible B through the slits 3 of the cold crucible B to heat and melt raw material. It also serves to form vortex within melt 5 obtained from a low purity Si scrap to diffusively move boron and phosphorus, the key elements of impurities, to the surface of the melt 5, thereby helping removal process of the elements, which will be described later.

Preferably, the cold crucible B further includes a magnetic field permeable cover 11, which is made of insulation material and surrounds an upper portion of the cold crucible B.

For continuously casting, UMG Si 6 is inserted in the inside of the cold crucible B with the bottom of the cold crucible B being blocked by a dummy bar 7 and an initial melt 5 is formed so that a melt dome reaches a point 5 mm below from the top of the cold crucible B, followed by descent of the dummy bar 7 at predetermined speed with continuous feed of the UMG Si 6, thereby fabricating an ingot continuously.

To feed crushed UMG Si into the cold crucible B, a UMG Si feeding means C is disposed within the vacuum chamber A. Feeding of properly crushed UMG Si 6 can raise process efficiency.

Next, in order to aid melting and volatilize the impurities from the surface of the melt 5 at a high temperature, the steam plasma torch D is disposed above the cold crucible B and the steam plasma torch D introduces reactive gas into plasma flame by inert gas to generate steam plasma and apply the steam plasma to the UMG Si fed to the cold crucible B.

The steam plasma torch D irradiates the plasma with high energy to the UMG Si fed to the cold crucible B. Accordingly, the melting and the refining of the UMG Si are performed, and once the melting is begun, electromagnetic induction by current flowing through the induction coil 1 in the vicinity of the cold crucible ensures melting of all the inserted UMG Si.

Boron and phosphorus, the key elements of the impurities contained in the melt 5 obtained from the UMG Si are particularly difficult to be removed as compared with other impurities. Boron and phosphorus have equilibrium distribution coefficients of 0.8 and 0.35, respectively, which are close to 1 as compared with those of other impurities, and impurity segregation is thus not generated well with unidirectional solidification system by slow cooling after melting in a crucible.

In order to remove boron and phosphorus, there is used a method of volatilizing these impurities into gaseous phases by applying high energy. However, though phosphorus is volatilized prior to volatilization of Si upon apply of high energy since phosphorus has a steam pressure higher than that of Si, boron has the steam pressure lower than that of Si and Si is volatilized prior to volatilization of boron upon apply of high energy. Therefore, a conventional Ar steam plasma torch has limitation in removal of boron.

Figure 2:
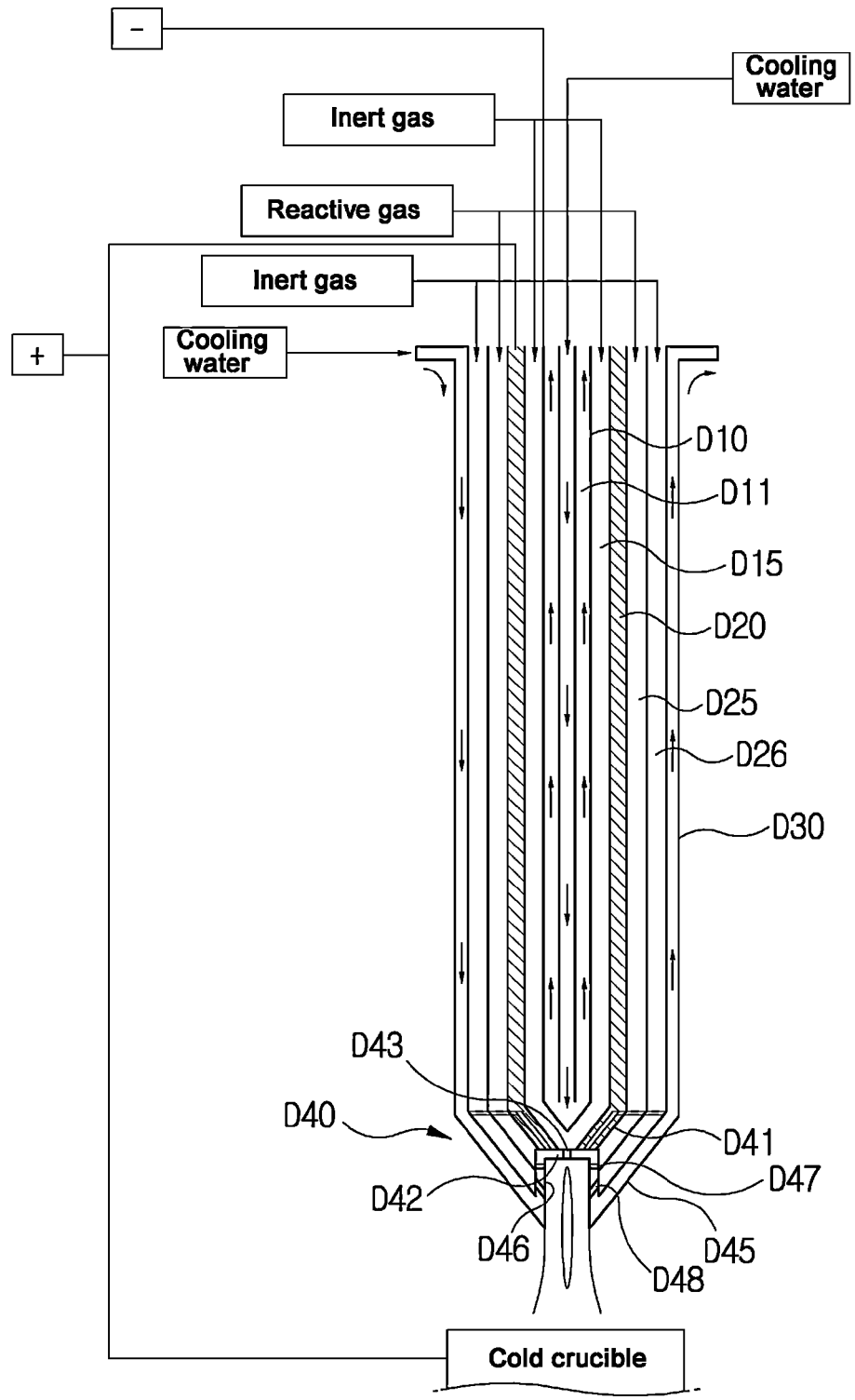
FIG. 2 is a schematic longitudinal view illustrating a plasma torch in accordance with a preferred embodiment of the present invention.

FIG. 2 is a longitudinal sectional view of a preferred plasma torch employed in the present invention to overcome the limitation of the conventional Ar steam plasma torch.

First, in the middle of the inside of the preferred plasma torch D1 in accordance with the present invention, an electrode rod D10 is disposed, which has a predetermined length and formed with a tip at an end thereof to be electrically connected with an external cathode power supply. Preferably, a cooling structure D11 is formed in an inside of the electrode rod D10, and the cooling structure D11 is connected with a cooling device to cool the electrode rod D10 by circulation of coolant, e.g. cooling water.

Next, a hollowed internal cover D20 surrounds the electrode rod D10 in a longitudinal direction of the electrode rod D10 with a first space D15 being formed between the internal cover D20 and the electrode rod D10, and is electrically connected with an external anode power supply. Preferably, the internal cover D20 is basically made of insulation material but partially formed with a conducting wire, through which current flows, from one side to the other side so that the anode power supply connected with the one side of the internal cover can be electrically connected with an internal nozzle cover D41 of a nozzle cover unit D40 which is connected with the other side of the internal cover D20 and will be described later.

Further, a hollowed external cover D30 surrounds the internal cover D20 in a longitudinal direction with a second space D26 being formed between the external cover D30 and the internal cover D20. Preferably, a cooling line which runs through the hollowed external cover D30, the external nozzle cover D45 and the internal nozzle cover D41, is formed in the insides of them to cool them, thereby capable of reducing thermal and corrosive environmental stress applied to them and thus enabling apply of larger power.

Next, the internal nozzle cover D41 and the external nozzle cover D45 that configure the nozzle cover unit D40 are coupled to the internal cover D20 and the external cover D30, respectively. The internal nozzle cover D41 covers the tip of the electrode rod, and has a horizontal nozzle end D42 formed at a lower end thereof, and the horizontal nozzle end D42 is formed with a first orifice D43. The external nozzle cover D45 covers the internal nozzle cover D41 except for the horizontal nozzle end D42, and has an open bottom and a vertical nozzle end D46 vertical to the horizontal nozzle D42 at a lower end thereof, the vertical nozzle end D46 is formed along circumference of the horizontal nozzle end D42 to the open bottom thereof, and the vertical nozzle end D46 is provided with a second orifice(s) D47 in the upper part thereof and a third orifice(s) D48 in the lower part thereof. Preferably, when plural second orifices D47 are formed, the second orifices D47 are to be in bisymmetry in regard to an axis along the electrode rod D11, and it is the same with the third orifices D48.

Here, to the first orifice D32 an inert gas (preferably, Ar) for generation of plasma is fed through the first space D15, to the second orifice D47 a reactive gas (preferably, H2, H2O or a mixture thereof) for formation of steam plasma is fed through a tube D25 installed in the second space D26, and to the third orifice D48 an inert gas (preferably, Ar) for generation of plasma is fed through the second space D26.

When the inert gas is fed to the first orifice D43 formed in the horizontal nozzle end D42, nontransferable plasma arc discharge is generated in a space between the tip of the electrode rod D10 connected with the cathode power supply and the horizontal nozzle end D42 of the internal nozzle cover D41 connected with anode power supply and generated plasma flame is discharged to the outside of the internal nozzle cover D41, i.e. a space (hereinafter, referred to as 'nozzle injection spaced') defined by the horizontal nozzle end D42 and the vertical nozzle end D46, through the first orifice D43 formed in the horizontal nozzle end D42 to form internal plasma flame. Next, the reactive gas is injected into the nozzle injection space through the second orifice D47 formed at an upper portion of the vertical nozzle end D46 and thus steam plasma is introduced in the internal plasma flame. Next, the inert gas is fed to the nozzle injection space through the third orifice D48 formed at a lower portion of the vertical nozzle end D46 to cover the introduced steam plasma is external plasma flame. Accordingly, it is possible to introduce the steam plasma stably between the internal plasma flame and the external plasma flame.

Next, when the anode power supply is connected to a basic material (for example, via the cold crucible), nontransferable plasma flame introduced with the steam plasma is converted into nontransferable plasma flame toward the base material.

Figure 3A:
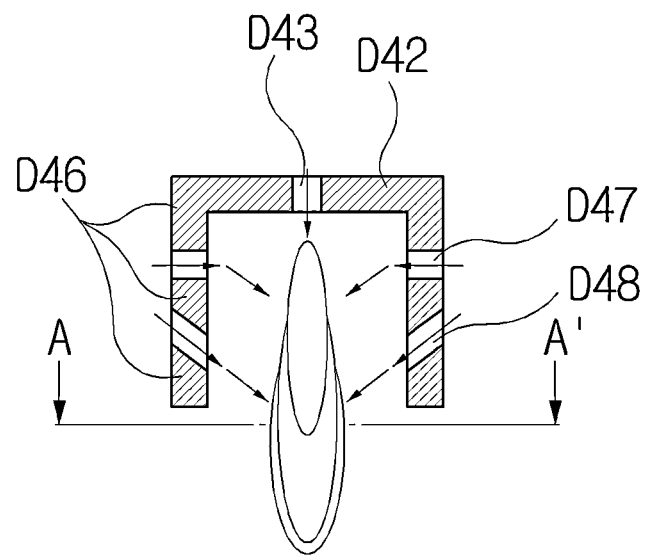
FIG. 3(a) is an enlarged view illustrating a nozzle injection space in FIG. 1.
Figure 3B:
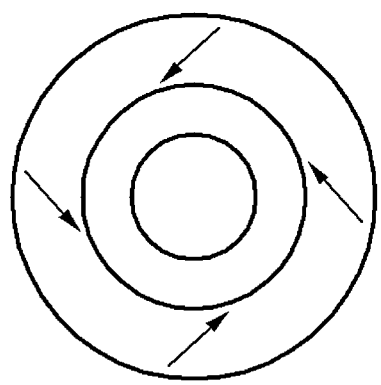
FIG. 3(b) is a cross sectional view taken along a line A-A' of the formed plasma flame in FIG. 3(a).

FIG. 3(a) is an enlarged view illustrating the nozzle injection space of the nozzle cover unit D40 in FIG. 2, and FIG. 3(b) is a cross sectional view taken along a line A-A' of the formed plasma flame in FIG. 3(a).

As illustrated in FIG. 3, with the plasma torch in accordance with the present invention, introduction of steam into the plasma flame is performed easily and stably to show excellent performance in raising the temperature of the plasma and creating reduction ambient.

As illustrated in FIG. 3(a), the second orifice D47 and the third orifice D48 are preferably formed in plural bisymmetrically on the vertical nozzle end D46, respectively, so that as illustrated in FIG. 3(b) the plasma arc itself is further stabilized, flow of thermal energy is concentrated into smaller section and permeation of air into the plasma flame can be prevented.

Preferably, the internal cover D20 is basically made of insulation material since it is relatively little influenced by heat and the external cover D30, and the nozzle cover unit D40 are made of conductive material since they are relatively largely influenced by heat so that they are sufficient cooled by the cooling line as described above.

The steam plasma torch D is installed above the melt in the cold crucible B within the vacuum chamber A so as to remove boron by feeding the reactive gas, i.e. gas suitable to promote volatilization of impurities, preferably a mixture of oxygen and hydrogen to the surface of the melt 5 obtained from the UMG Si. Preferably, the mixture of oxygen and hydrogen can be easily fed by gasification of refined high purity water. The reactive gas fed as such reacts with impurities diffusively moving to the surface of the melt 5 by the vortex formed in the inside of the melt 5 in the cold crucible B to thereby aid volatilization of the impurities.

Though boron (boiling point: 2820K) is less volatile than Si (boiling point: 2540K), addition of reactive gas, i.e. hydrogen or water can raise volatility by steam pressure or volatility by formation of compound. Under this condition, boron is volatilized in forms of (mainly) BHO, BO and BH. When hydrogen is added, the boron forms and is volatilized in the form of a compound such as BH as the temperature of the plasma is further raised by influence of hydrogen ion, and when oxygen is added, the boron is volatilized in the form of an oxide such as BO, BO2. Also, when H2O is added, the boron forms BOH, which has highest volatility. Therefore, hydrogen and water are required for effective removal of boron.

Figure 4:
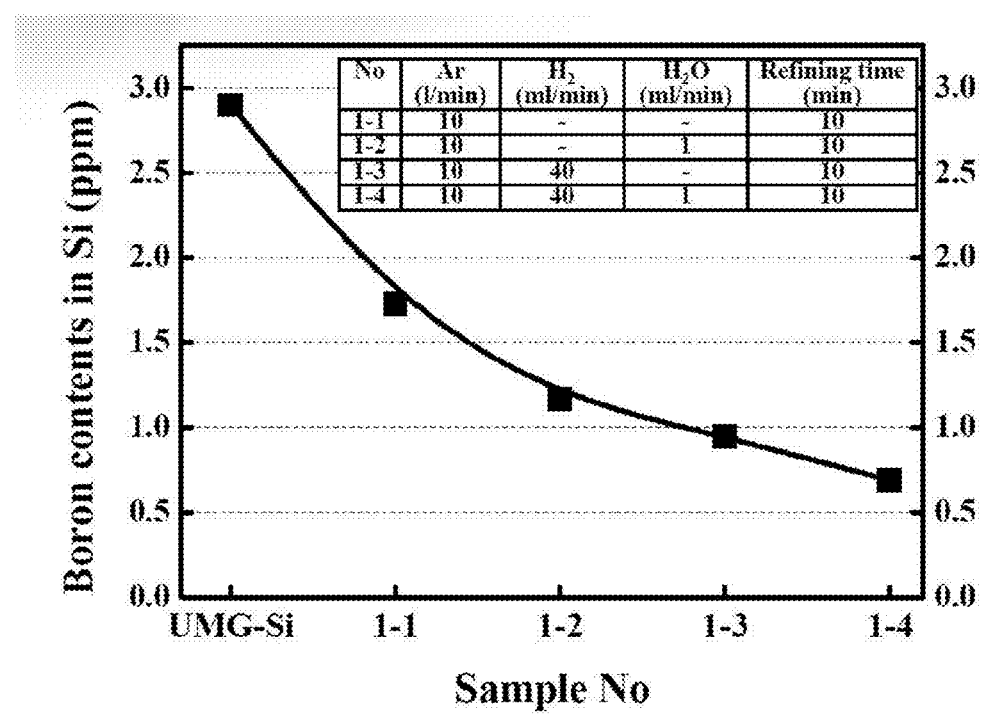
FIG. 4 shows refining ratio of boron according to the kind of the plasma reactive gas in a preferred embodiment of the present invention.

FIG. 4 shows refining ratio of boron according to the kind of the plasma reactive gas in a preferred embodiment of the present invention. As can be seen from FIG. 4, effect of refining boron is notably increased as hydrogen gas and steam are additionally injected together with argon gas within the same time.

Figure 5:
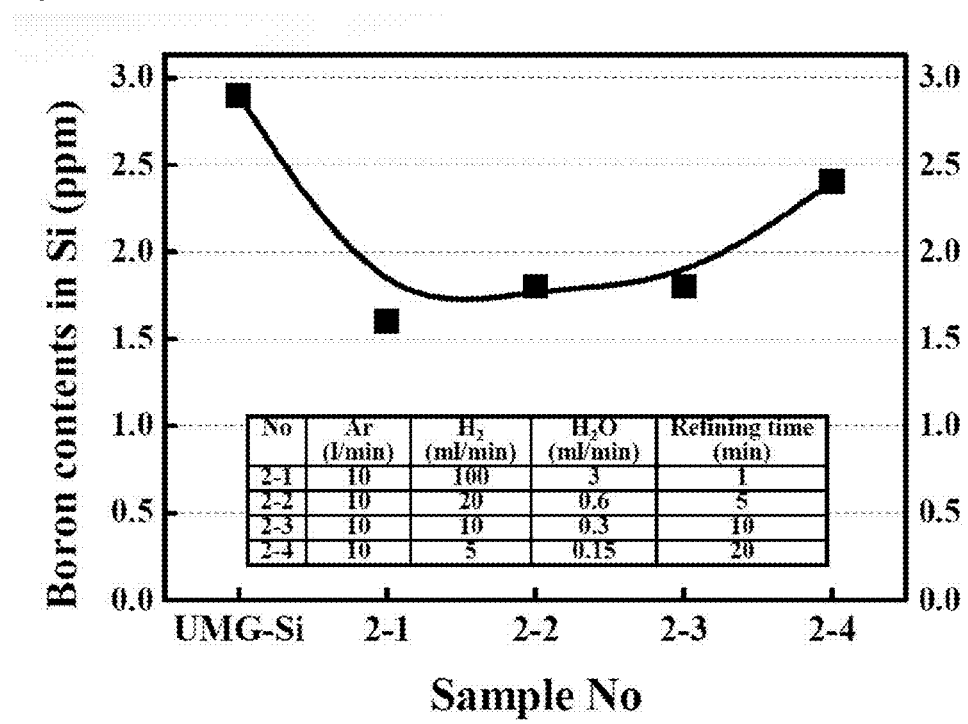
FIG. 5 shows refining effect according to process time with total amount of the plasma reactive gas being fixed in a preferred embodiment of the present invention.

FIG. 5 shows refining effect according to process time with total amount of the plasma reactive gas being fixed in a preferred embodiment of the present invention. As shown in FIG. 5, the effect of refining boron is generally lowered as the process time is lengthened with total amount of the fed plasma reactive gas being fixed.

Figure 6:
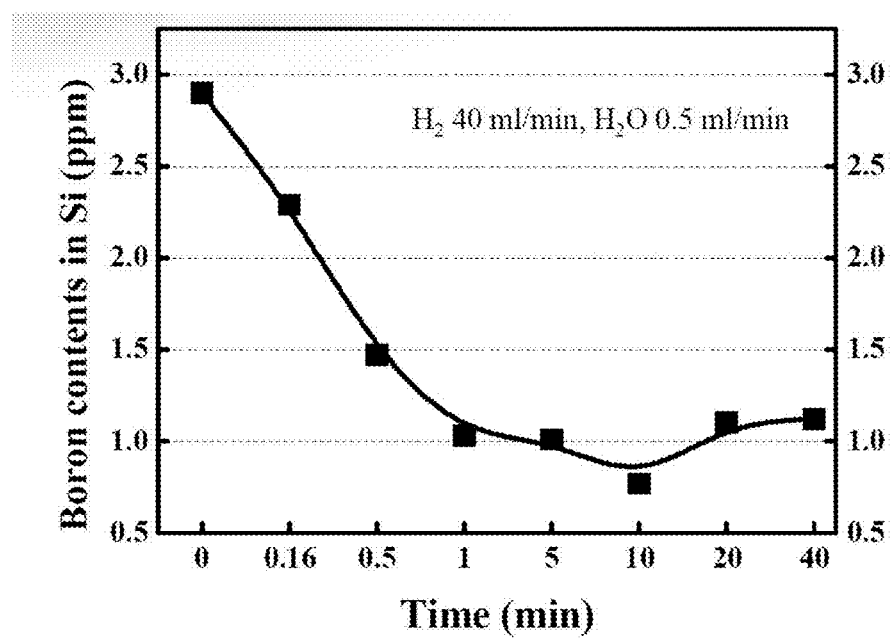
FIG. 6 shows refining effect according to the process time in a preferred embodiment of the present invention.

FIG. 6 shows refining effect according to the process time (Ar 10 L/min) in a preferred embodiment of the present invention. AS shown in FIG. 6, though boron refining ability is increased as the process time is increased in the period from 0.16 to 10 minutes, the boron removal ratio is rather lowered after lapse of 10 minutes.

Figure 7:
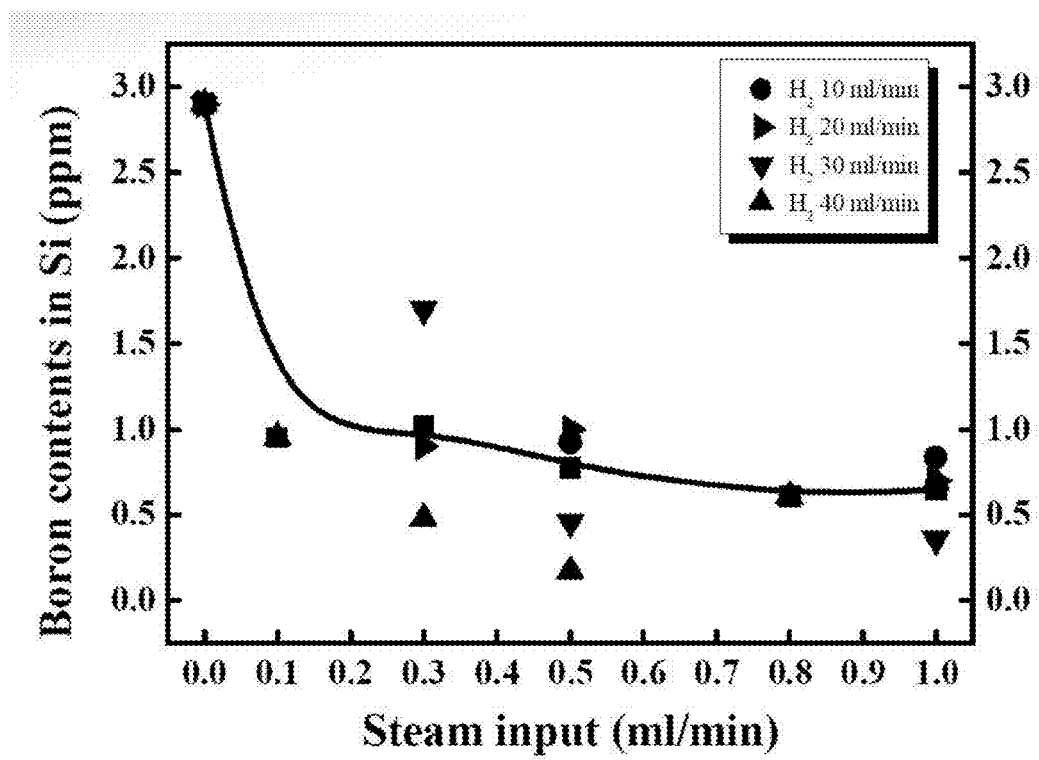
FIG. 7 shows boron removal ratio according to the flow rate of the plasma reactive gas in a preferred embodiment of the present invention.

FIG. 7 shows boron removal ratio according to the flow rate of the plasma reactive gas (Ar 10 L/min) in a preferred embodiment of the present invention. As can be seen from FIG. 7, the concentration of boron was reduced from 2.9 ppmw at an initial stage to 0.17 ppmw. In other words, the boron removal ratio was about 94%.

In the steam plasma torch in accordance with a preferred embodiment of the present invention, it is preferable that a ratio of the reactive gas to the inert gas fed to the first orifice and the third orifice is 0.1 to 10.0 vol %.

Next, the impurity collector F for collecting and removing the impurity gas generated in the cold crucible B within the vacuum chamber A is disposed. Preferably, the impurity collector F includes a collecting plate F1 disposed above the cold crucible B to collect the vacuum chamber gas including impurity generated from the cold crucible B; an discharge pipe connected to the collecting plate F1 at one end thereof to discharge the collected vacuum chamber gas to the outside of the vacuum chamber A; a dust collector F3 connected with the other end of the discharge pipe to collect the gaseous impurities from the vacuum chamber gas into dust; a filter F4 received the vacuum chamber gas from the dust collector F3 to filtrate and refine the fine powdery impurities out of vacuum chamber gas; and an introduction pipe F5 for introducing the vacuum chamber gas in which the impurities are refined to the inside of the vacuum chamber A. Preferably, the dust collector F3 includes a cooling system F3a for cooling the dust into solid phase. Preferably, a cooling structure F6 is installed on the impurity collecting plate F1. With this impurity collector, it is possible to selectively remove impurities that cause secondary contaminant while maintaining gases useful for refinement among the gases remained in the inside of the chamber.

Preferably, the system for refining UMG Si in accordance with a preferred embodiment of the present invention further includes a steam generator G for feeding steam from the outside of the steam plasma into the steam plasma torch.

Figure 8:
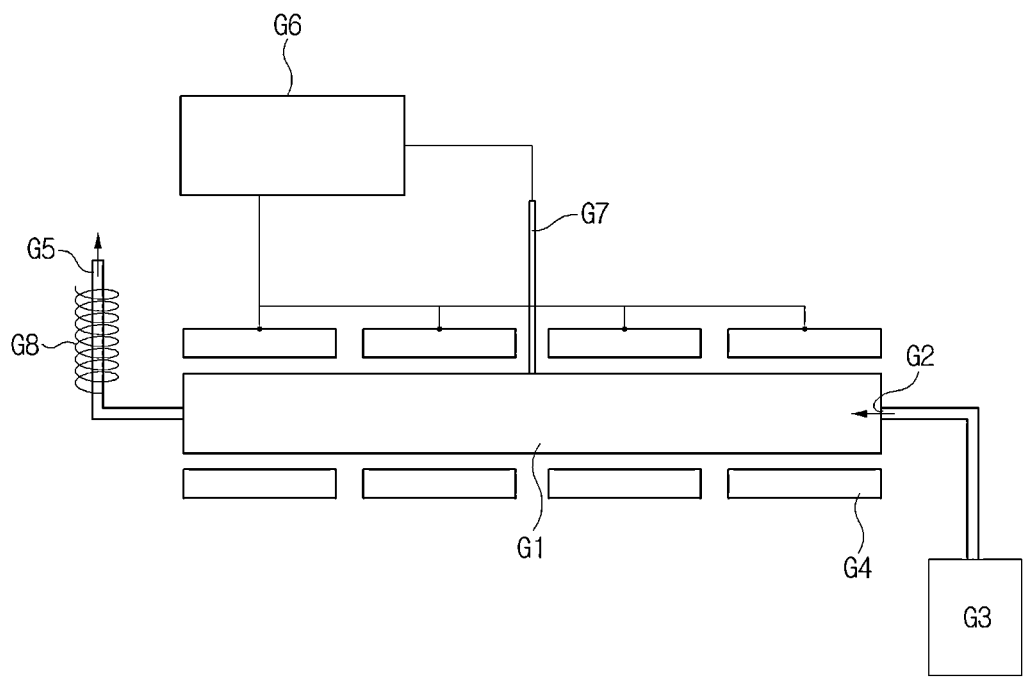
FIG. 8 is a schematic view illustrating a structure of a steam generator in accordance with a preferred embodiment of the present invention.

FIG. 8 illustrates a structure of the steam generator G for raising efficiency of steam generation. In FIG. 8, water is fed to an inlet G2 of an end of a cylinder G1 (for example, material: SUS-310, diameter: 100 mm, length: 800 mm) by a water pump G3 (for example, capacity: 0.3~2280 ml) and the fed water is heated by a ceramic band heater G4 (capacity: 750 W×4 (<400° C.)) installed along a circumference of the cylinder G1 during flowing through the cylinder G1 to discharge steam through an outlet G5 of the other end of the cylinder G1. A control box G6 is connected with the ceramic band heater G4 and a temperature measurer G7 for measuring an internal temperature of the cylinder G1, and measures the internal temperature of the cylinder G1 to control the ceramic band heater G4, thereby capable of keeping the inside of the cylinder at a fixed temperature (for example, about 400° C.). Preferably, the cylinder G1 can be further heated by a heating band G8 to keep steam state until the steam is discharged through the outlet G5.

Figure 9:
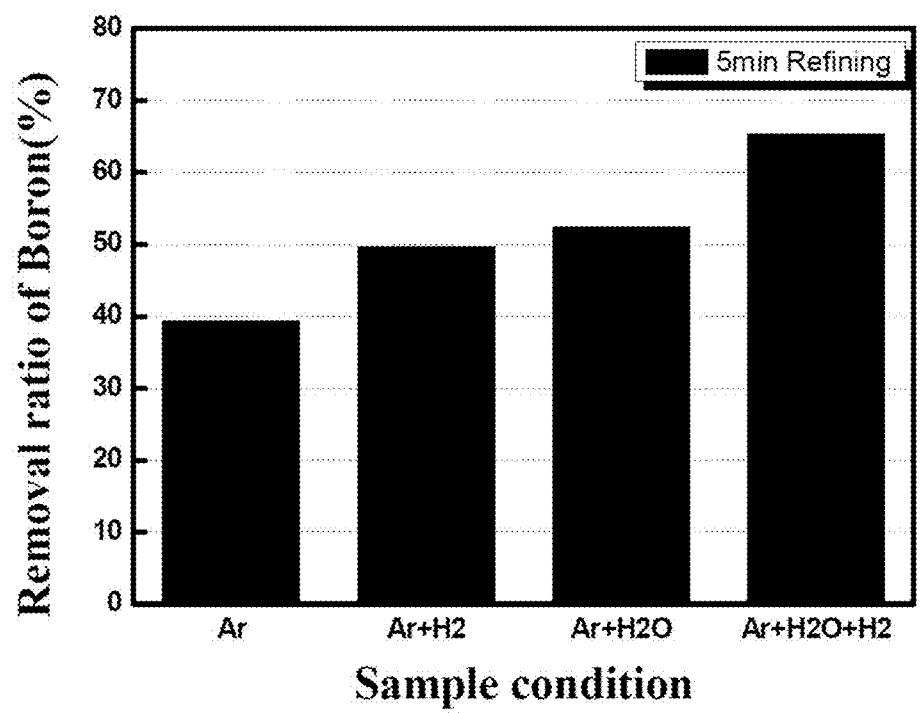
FIG. 9 shows removal ratio of boron from Si according to whether Ar, H2, H2O, or the reactive gas is added in the system in accordance with the present invention.

FIG. 9 shows removal ratio of boron form Si according to whether Ar, H2, H2O, or the reactive gas are added when the refinement is performed for 5 minutes with the system in accordance with the present invention. From the result of refinement using UMG Si containing several ppm of boron, it was confirmed that it is possible to remove boron into a level of 0.1 to 0.3 ppm, which is required for a SG Si. Also, for variation according to mixing with the reactive gas, it can be appreciated that the boron refinement effect is larger when H2 and H2O are put together into Ar gas, as compared when each of H2 and H2O is put into Ar gas, respectively.

Figure 10:
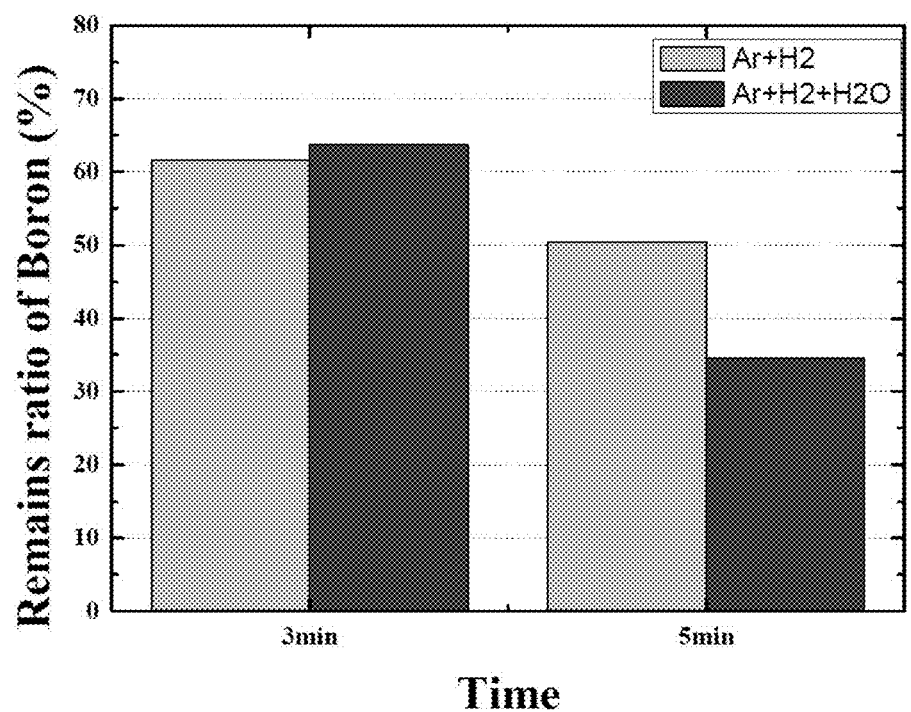
FIG. 10 shows a residual rate of boron in Si according to refining time as the result of refining UMG Si in the system in accordance with the present invention.

FIG. 10 shows a residual rate of boron in Si according to refining time as the result of refining UMG Si with the system in accordance with the present invention. Both cases show that boron removal effect is increased as the refining time is increased. Also, it can be appreciated that the boron removal effect is larger as refining time is increased when H2O is additionally mixed with Ar and H2. This is because boron forms strong volatile compound such as BOH by addition of H2O into the reactive gas, besides influence of hydrogen.

Figure 11:
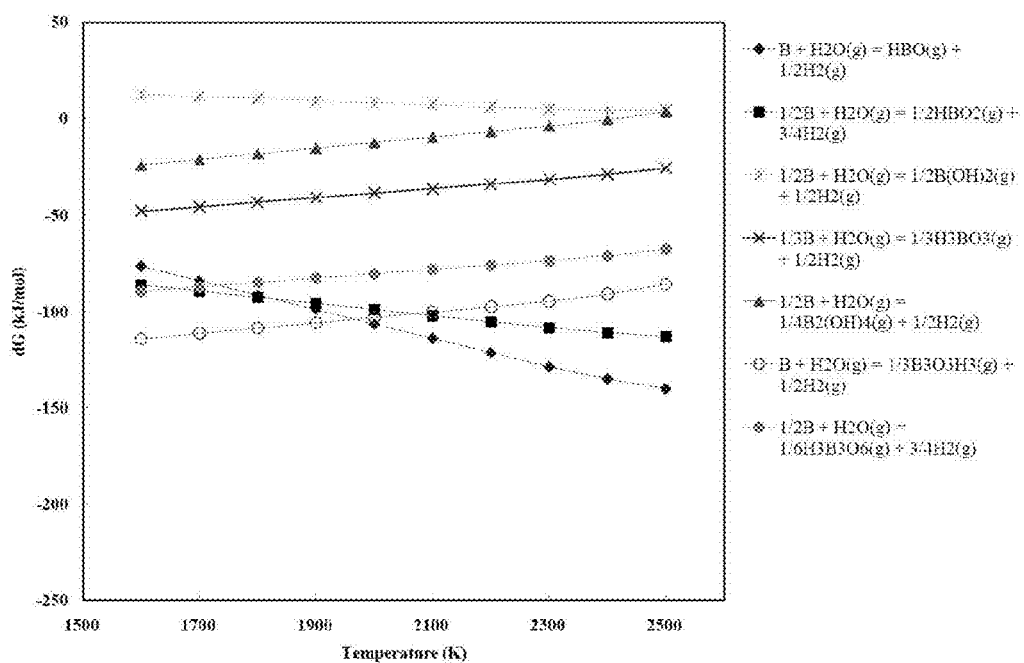
FIG. 11 is a graph of free energy calculated based on thermodynamics for oxides of boron producible when H2O is added as the reactive gas in the system in accordance with the present invention.

FIG. 11 is a graph of free energy calculated based on thermodynamics for oxides of boron producible when H2O is added as the reactive gas. Considering that when refining Si with the system a temperature range is 2000 to 4000 in a section into which plasma is injected, it can be appreciated from FIG. 11 that the most stable boron compound at a temperature range of over 2000K is BOH.

Figure 12:
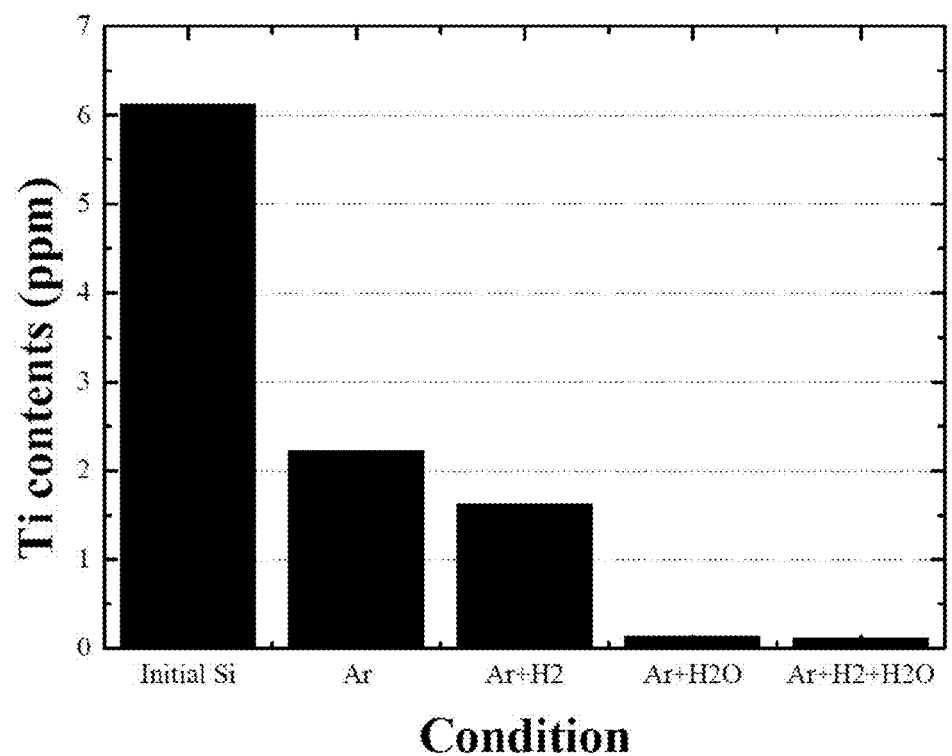
FIG. 12 is a graph showing variation of amount of metal impurities in Si with change of the reactive gas after refinement in the system in accordance with the present invention.

FIG. 12 is a graph showing variation of amount of metal impurities in Si with change of the reactive gas after refinement using the system in accordance with the present invention. As the result of analysis, the metal impurities such as Al and Ti also form compound with the reactive gas and is thus volatilized. As the result of analysis, Al is volatilized at all and not detected in all cases, and Ti is volatilized as oxide to hundreds ppb when steam is added. This shows that the system also has refining effect on metal impurities other than boron.

While the present invention has been described with respect to the specific embodiments, it will be apparent to those skilled in the art that various changes and modifications may be made without departing from the spirit and scope of the invention as defined in the following claims.

What is claimed is:

1. System for refining UMG Si using steam plasma torch, comprising:
    a vacuum chamber;
    a cold crucible disposed within the vacuum chamber;
    a device for feeding UMG Si to the cold crucible;
    a steam plasma torch applying steam plasma to the Si fed to the cold crucible, the steam plasma formed by introducing a reactive gas into plasma flame by a first inert gas; and
    an impurity collector for collecting impurity gas generated from the cold crucible,
    wherein the plasma torch includes:
    an electrode rod having a predetermined length and formed with a tip at an end thereof and being electrically connected with an external cathode power supply;
    an internal cover surrounding the electrode rod in a longitudinal direction of the electrode rod with a first space formed between the internal cover and the electrode rod and being electrically connected with an external anode power supply;
    an external cover surrounding the internal cover in the longitudinal direction with a second space formed between the external cover and the internal cover;
    a nozzle cover unit having an internal nozzle cover connected with the internal cover and an external nozzle cover connected with the external cover, the internal nozzle cover covering the tip and having a horizontal nozzle end formed at a lower end thereof, the horizontal nozzle end being formed with a first orifice, the external nozzle cover covering the internal nozzle cover except for the horizontal nozzle end and having open bottom and a vertical nozzle end vertical to the horizontal nozzle end at a lower end thereof, the vertical nozzle end formed along a circumference of the horizontal nozzle end to the open bottom of the external nozzle cover, the vertical nozzle end being formed with a second orifice(s) in the upper part thereof and a third orifice(s) in the lower part thereof,
    wherein to the first orifice the first inert gas for generation of plasma is fed through the first space, to the second orifice the reactive gas for formation of steam plasma is fed through a tube installed in the second space, and to the third orifice a second inert gas for generation of plasma is fed through the second space.

2. The system of claim 1, wherein the impurity collector includes:
    a collecting plate for collecting the vacuum chamber gas including impurity generated from the cold crucible;
    an discharge pipe for discharging the collected vacuum chamber gas by the collecting plate to the outside of the vacuum chamber;
    a dust collector for collecting a dust of the gaseous impurities from the vacuum chamber gas received through the discharge pipe;
    a filter for filtering the vacuum chamber gas received from the dust collector to remove the fine powdery impurities out of the vacuum chamber gas; and
    an introduction pipe for introducing the filtered vacuum chamber gas to the inside of the vacuum chamber.

3. The system of claim 2, wherein the dust collector includes a cooling system for cooling the dust into solid phase.

4. The system of claim 2, wherein the impurity collector further includes a cooling structure installed on the impurity collecting plate.

5. The system of claim 1, wherein the second orifices are formed in bisymmetry and the third orifice(s) are formed in bisymmetry.

6. The system of claim 1, wherein the first inert gas is Ar.

7. The system of claim 1, wherein the reactive gas is one or more selected from the group consisting of $H_2$ and $H_2O$.

8. The system of claim 1, wherein a ratio of the reactive gas to the first inert gas fed to the first orifice and the third orifice(s) is 0.1 to 10.0 vol %.

9. The system of claim 1, wherein a cooling structure is formed in an inside of the electrode rod.

10. The system of claim 1, wherein the cold crucible is electrically connected with the anode power supply.

11. The system of claim 1, wherein cooling lines are formed along the external cover and the nozzle cover unit, respectively.

12. The system of claim 1, further comprising a steam generator for feeding steam from the outside of the steam plasma into the steam plasma torch.

13. The system of claim 1, wherein the cold crucible is an open-bottom cold crucible.

14. The system of claim 13, wherein the cold crucible is structured in such a manner that at least part thereof along the circumference is divided into segments by means of vertical slits formed from the top to the bottom thereof.

* * * * *